United States Patent [19]

Babbitt et al.

[11] Patent Number: 5,068,627

[45] Date of Patent: Nov. 26, 1991

[54] NARROW BAND MICROSTRIP ISOLATOR

[75] Inventors: Richard W. Babbitt, Fair Haven; Adam Rachlin, Eatontown; Thomas E. Koscica, Clark, all of N.J.

[73] Assignee: The United States of America as represented by the Secretary of the Army, Washington, D.C.

[21] Appl. No.: 617,130

[22] Filed: Nov. 19, 1990

[51] Int. Cl.⁵ .................. H03B 5/18; H01P 1/365
[52] U.S. Cl. ..................... 331/99; 331/107 SL; 331/117 D; 333/24.2
[58] Field of Search .............. 333/17.2, 24.1–24.3; 331/96, 99, 107 SL, 117 D

[56] References Cited

U.S. PATENT DOCUMENTS

| 3,317,863 | 5/1967 | Ngo | 333/24.2 X |
| 3,715,692 | 2/1973 | Reuss, Jr. | 333/24.1 |
| 4,028,639 | 6/1977 | Hagon et al. | 331/96 X |
| 4,283,692 | 8/1981 | Adam | 333/24.2 X |
| 4,290,017 | 9/1981 | Fortunko | 331/117 D X |

FOREIGN PATENT DOCUMENTS 2223371 4/1990 United Kingdom ............... 331/96

Primary Examiner—Paul Gensler
Attorney, Agent, or Firm—Michael Zelenka; William H. Anderson

[57] ABSTRACT

A resonant microwave isolator is described in which a diagonal slot is formed in the top conductor of a microstrip, a strip of ferromagnetic material is mounted over at least a portion of the slot and magnetic flux is established in the ferromagnetic material in a direction intersecting the slot.

14 Claims, 5 Drawing Sheets

NARROW BAND MICROSTRIP ISOLATOR

GOVERNMENT INTEREST

The invention described herein may be manufactured, used, and licensed by or for the Government for governmental purposes without the payment to us of any royalty thereon.

FIELD OF THE INVENTION

This invention relates to a linear narrow band microstrip ferrite resonance isolator capable of operating in the millimeter wave frequency range in a microstrip transmission line.

BACKGROUND OF THE INVENTION

As is well known by those skilled in the art, a microstrip is comprised of a planar substrate of dielectric material having a conductive layer covering one side that serves as a ground plane and a top conductor that is about one-tenth the width of the substrate extending along the center of its other side. The top conductor and the ground plane form a waveguide through which microwaves can pass in either direction. When a resonance isolator is incorporated with the microstrip, it absorbs energy from microwaves flowing in one direction so as to block them, but does not absorb energy from microwaves flowing in the other direction so as to permit them to pass.

In one form of resonance isolator, the top conductor is formed in a circular path and microwaves are permitted to flow in only one direction around the circle, but this takes up considerable space on the surface of the substrate.

In U.S. Pat. No. 4,806,886, which is incorporated herein by reference, a resonant isolator is described that lies along the top conductor. A gap is formed in the top conductor during the etching process, and a waveguide element having a dielectric constant significantly greater than that of the substrate is mounted within the gap. The waveguide element has a central section of uniform height and a ramp at either end, and a conductive strip is adhered to its top and joined by soldering to the top conductor at the ends of the gap. This structure requires a number of manufacturing steps that greatly increase the cost.

SUMMARY OF THE INVENTION

In accordance with this invention a diagonal slot is formed in the top conductor during the etching process, a strip of ferromagnetic material is mounted on the top side of the substrate in registration with the slot and means are provided for creating magnetic flux in the strip of ferromagnetic material that is in such direction as to extend across the slot. Microwaves having a frequency, determined by the length of the slot that travel in one direction are coupled to the layer of magnetized ferromagnetic material via the slot and absorbed therein so as to be blocked, but microwaves traveling in the opposite direction are not coupled to the magnetized ferromagnetic material so that they freely pass along the strip. The degree of absorption is zero when the slot is parallel to the top conductor and increases with the angle between it and the strip.

Production of magnetic flux in the strip of ferromagnetic material may be achieved with a permanent magnet or by passing current through a conductor wrapped around the material. Although somewhat greater losses may result, the strip of material may be hexagonal ferrite that has been magnetized in any suitable manner so that additional means such as a magnet or wire coiled about it are not required to produce a magnetic flux within it.

A distinct advantage of the resonant isolator of this invention is that it can be inexpensively incorporated into a microstrip circuit by simply forming the slot referred to in the top conductor during the etching process and adding the strip of ferromagnetic material, and, if required, additional means for producing magnetic flux in the ferromagnetic material can be added.

BRIEF DESCRIPTION OF THE DRAWINGS

In the various figures of the drawings, elements performing corresponding functions are designated in the same manner, and certain dimensions are relatively exaggerated in order that their construction may be more easily observed.

DETAILED DESCRIPTION

Figure 1A:
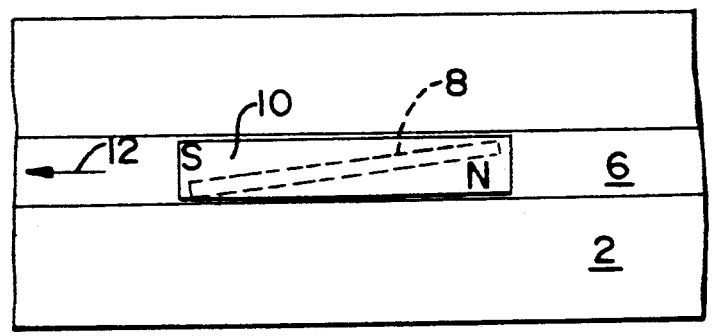
FIGS. 1A, 1B, and 1C, respectively, illustrate top, side and elevation views of a preferred embodiment of the invention in which the strip of ferromagnetic material and a permanent magnet are on opposite sides of the substrate on which a microstrip circuit is formed.
Figure 1B:
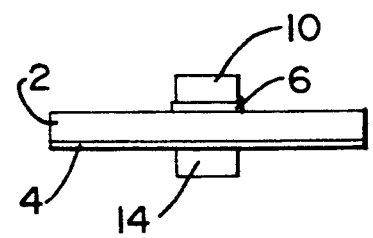
Figure 1C:
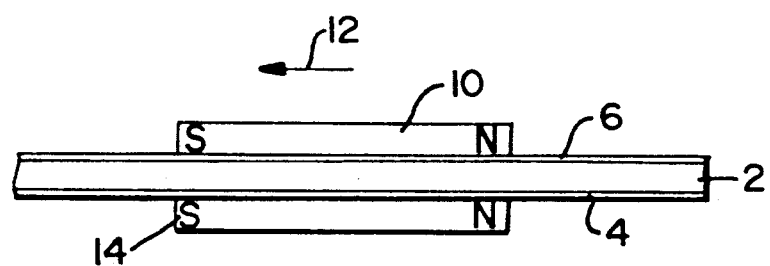
Figure 2A:
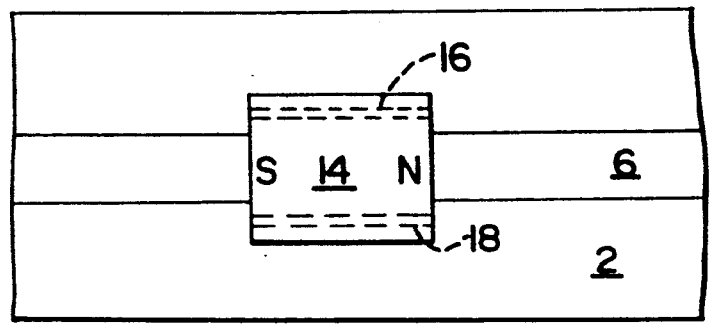
FIGS. 2A, 2B, 2C, and 2D, respectively, illustrate the top, end, and elevational views and a section 2D,2D of FIGS. 2B and 2C of one specie of a resonant isolator of the invention in which the strip of ferromagnetic material and a permanent magnet are on the same side of the substrate and spaced from each other.
Figure 2B:
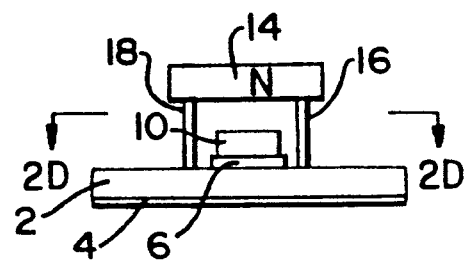
Figure 2C:
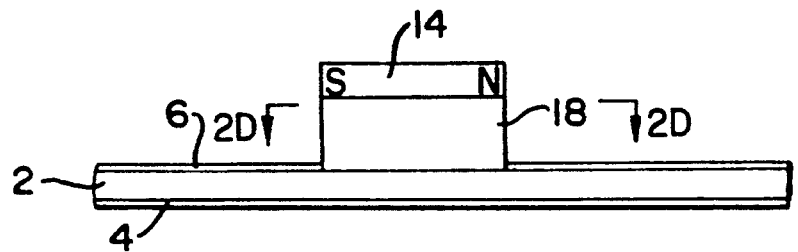
Figure 2D:
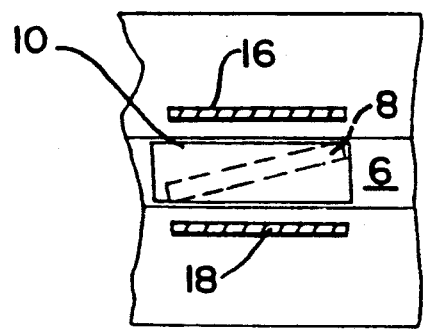

The preferred specie of the invention shown in FIGS. 1A, 1B, and 1C is comprised of a dielectric substrate 2 having one surface covered with conductive material 4 and a top conductor 6 on the other surface. In accordance with the invention, a diagonal slot 8, seen only in FIG. 1A, is provided on the top conductor 6 that is at an angle with it. A strip 10 of ferromagnetic material such as ferrite is adhered to the strip 6 so as to be over the slot 8, and is magnetized with the polarity indicated in FIG. 1A so as to permit microwaves to flow in the direction of the arrows 12. In this preferred specie, a permanent magnet 14 having the indicated polarity is attached to the ground plane 4 with an adhesive. The total thickness of the isolator constructed in this manner is approximately 0.28 inch.

In the specie of FIGS. 2A-2D, a magnetic field is produced in the strip 10 of ferromagnetic material by supporting the magnet 14 in spaced relationship therewith with support members 16 and 18. The thickness of the air gap between the strip 10 and the magnet 14 is 0.1 inch, and the thickness of the magnet 14 is 0.25 inch. The slot 8 is only seen in FIG. 2D, which is a section 2D of FIGS. 2B and 2C. Thus, the magnet 14 is on the same side of the substrate 2 as the top conductor 6 and the strip 10 of ferromagnetic material.

Figure 3A:
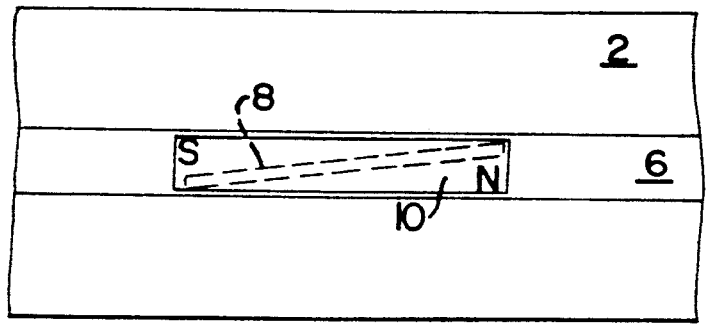
FIGS. 3A, 3B, and 3C respectively show the top, end, and elevational views of another specie of a resonant isolator of the invention in which the strip of ferromagnetic material and a permanent magnet are on the same side of the substrate and separated by a strip of dielectric material.
Figure 3B:
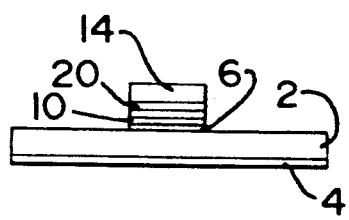
Figure 3C:
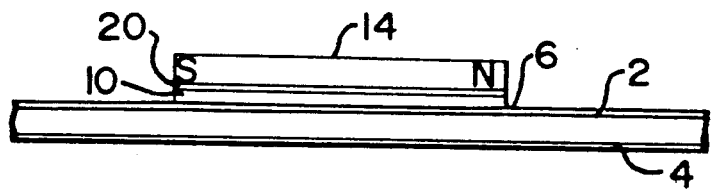

The specie of FIGS. 3A, 3B, and 3C is similar to that of FIGS. 2A-2D, except that the support means 16 and 18 are eliminated and a strip 20 of dielectric material such as mica having a thickness of 0.1 inch is adhered between the strip 10 of ferromagnetic material and the magnet 14.

Figure 4A:
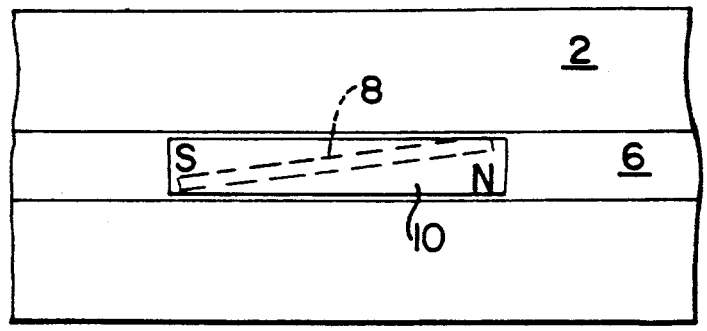
FIGS. 4A and 4B, illustrate a resonant isolator of the invention in which the strip of ferromagnetic material is magnetized hexagonal ferrite so as not to require additional means for producing magnetic flux in it.
Figure 4B:
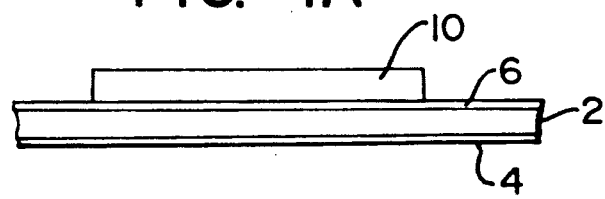

In the specie shown in FIGS. 4A and 4B, the means for producing magnetic flux in the strip 10 of ferromagnetic material is the orientation of its atomic particles brought about by subjecting it to a magnetic field. In this case, the ferromagnetic material 10 must be such as to retain its magnetized state. A good material for this purpose is hexagonal ferrite.

Figure 5:
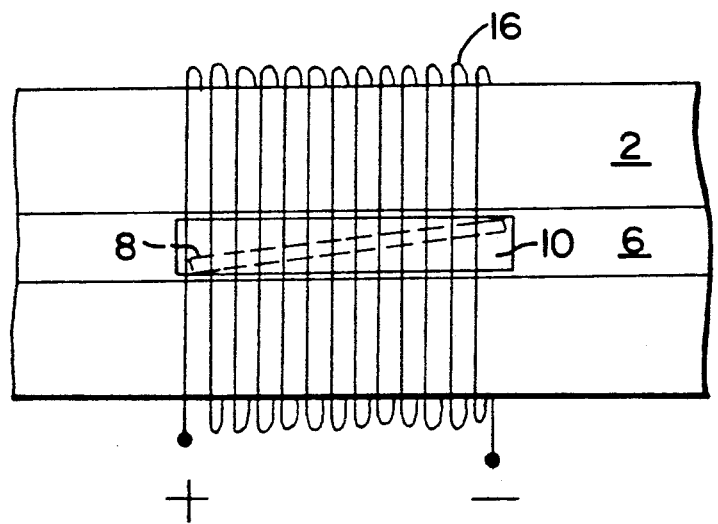
FIGS. 5 and 5A illustrate one structure for establishing magnetic flux in the magnetic material by means of wire coiled about it.
Figure 5A:
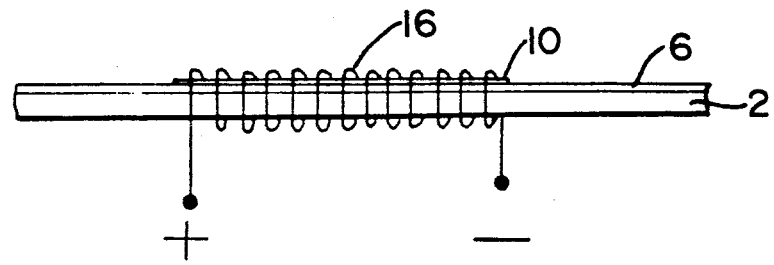

As indicated earlier, the means for producing magnetic flux in the strip 10 of ferromagnetic material can be a coil of wire wound about the strip 10 and means for causing a flow of current through the wire. One such arrangement is illustrated in FIGS. 5 and 5A wherein wire 16 is wound about the substrate 2 and the strip 10 of ferromagnetic material. The ends of the wire 16 are respectively connected to positive and negative points of D.C. potential.

Figure 6:
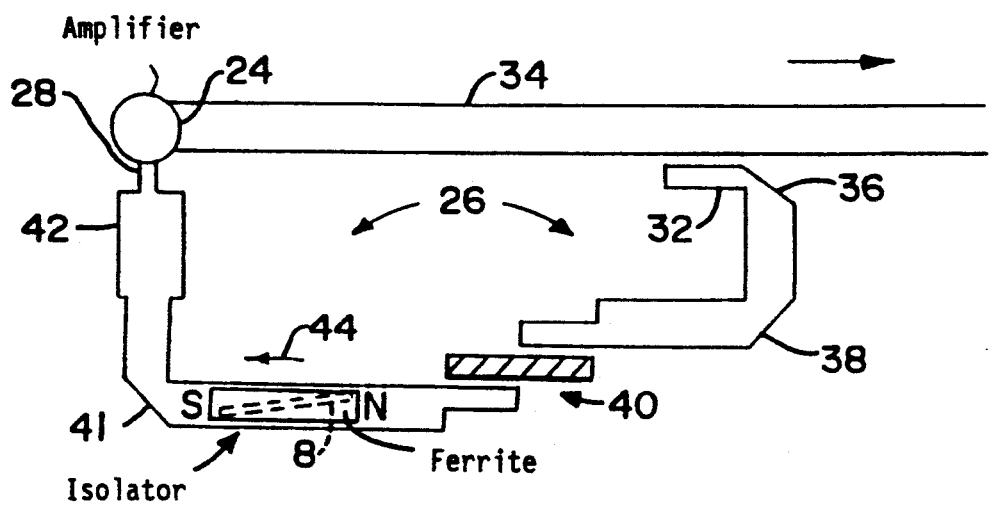
FIG. 6 illustrates an oscillator circuit using any one of the specie of resonant isolators of this invention in its feedback path.

Reference is now made to the oscillator circuit of FIG. 6, which is comprised of an amplifier having an output port 24 that is coupled via feedback circuitry 26 to its input port 28 via a path including a resonant isolator like that of FIGS. 4A and 4B. It will be understood, however, that the resonant isolator could be any of the species described as well as their equivalents. An important feature of the resonant isolator of this invention is that it is an integral part of a circuit in which it is used. It is only necessary to provide a slot 8 in the microstrip 6 at any convenient location and add the components as required by any one of the various species.

In this particular circuit, the feedback circuit 26 is comprised of a directional coupler 32 coupled to a strip 34 that is connected to the output port 24, circuit corners 36 and 38, a quarter wave band pass filter 40, the resonant isolator of this invention, a circuit corner 41 and an impedance matching section 42. Microwave signals only flow in the direction of the arrow 44.

Figure 7:
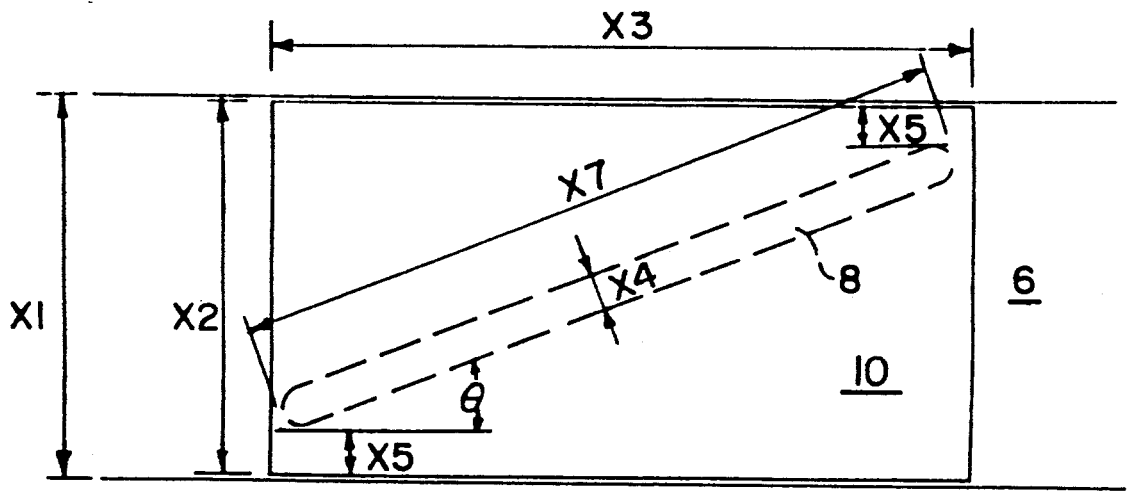
FIG. 7 is a top view in which a strip of ferromagnetic material is considered to be transparent.
Figure 7A:
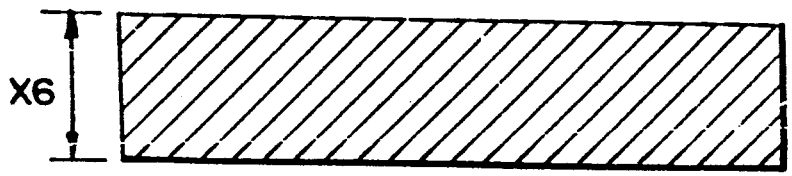
FIG. 7A is an elevational view of FIG. 7.

Although various dimensions may be used, a resonant isolator like that of FIGS. 1A, 1B, and 1C was found to work very well in an oscillator circuit of FIG. 6 when the following slot dimensions shown in FIGS. 7 and 7A were used as follows in Table 1:

TABLE 1

| X1 = .030 inch | X5 = .005 inch |
|---|---|
| X2 = .030 inch | X6 = .030 inch |
| X3 = .150 inch | X7 = .150 inch |
| X4 = .005 inch | |

The thickness of the magnet is about 0.090 inch.

A discussion of the operational parameters of a slot formed on a microstrip as herein described is to be found in an article incorporated by reference herein entitled "Wide-Band Ground-Plane dc Block and Bias Feed" written by Thomas E. Koscica, one of the inventors of this invention, that appeared in IEEE Transactions On Microwave Theory and Techniques, Vol 38, No.6, June 1990, pages 805 and 806. The particular portion of the article pertinent to the slot of this invention is that found on page 806 relating to FIG. 4. In order to couple energy through the slot 8 into the ferromagnetic strip 10, there must be a nonzero angle Θ between the slot length and the incident signal traveling along the top conductor 6. No energy is coupled when the Θ=0. The operational frequency for this particular slot is 36 GHz, its bandwidth is 0.7 GHz and its isolation ratio, i.e. the ratio of forward to reverse energy transmission is 7 dB. If the width of the slot is doubled while leaving all other dimensions the same, the bandwidth is increased by 25%.

What is claimed is:

1. A resonant microstrip isolator comprising:
   a dielectric substrate;
   a conductive surface on one side of said dielectric substrate for forming a ground plane;
   a top conductor on the opposite side of said dielectric substrate, the top conductor being narrower in width than said conductive surface so as to form a microstrip line;
   means forming an elongated slot in said top conductor that is at an angle with respect thereto;
   a strip of ferromagnetic material mounted so as to be in registration with at least a portion of said slot; and
   means for producing magnetic flux in said strip of ferromagnetic material that is directed across said slot.

2. A resonant microstrip isolator as set forth in claim 1 wherein:
   said strip of ferromagnetic material is ferrite, and
   said means producing magnetic flux in said strip includes at least one permanent magnet.

3. A resonant microstrip isolator as set forth in claim 1 wherein said means producing magnetic flux in said strip of ferromagnetic material is comprised of:
   a permanent magnet adhered to said conductive surface.

4. A resonant microstrip isolator as set forth in claim 1 wherein said means producing magnetic flux in said strip of ferromagnetic material is comprised of:
   dielectric support members adhered to the surface of said substrate on opposite sides of said top conductor, and
   a permanent magnet mounted on said support members so as to be spaced from said top conductor.

5. A resonant microstrip isolator as set forth in claim 1 wherein said means producing magnetic flux in said strip of ferromagnetic material is comprised of:
   a layer of dielectric material adhered to said strip of ferromagnetic material, and
   a permanent magnet adhered to said layer of dielectric material.

6. A resonant microstrip isolator as set form in claim 1 wherein said means producing magnetic flux in said ferromagnetic material is comprised of:
   a conductor wrapped around said strip of ferromagnetic material and said substrate.

7. A resonant microstrip isolator as set forth in claim 1 wherein:
   said strip of ferromagnetic material is hexagonal ferrite, and said means producing magnetic flux therein is the orientation of particles within said hexagonal ferrite brought about by having been subjected to a magnetic field.

8. An oscillator comprising:

an amplifier having an input port and an output port; and a feedback path coupled between said output port and said input port including a resonant microstrip isolator arranged to pass microwaves from said output port to said input port, wherein the resonant microstrip isolator comprises a dielectric substrate, a conductive surface on one side of said dielectric substrate so as to form a ground plane, a top conductor on the opposite side of said substrate, the top conductor being narrower in width than said conductive surface so as to form a microstrip line, means forming an elongated slot in said top conductor that is at an angle with respect thereto, a strip of ferromagnetic material mounted in registration with said slot so as to cover at least a portion thereof, and means for producing magnetic flux in said strip of ferromagnetic material that is extends across said slot.

9. An oscillator as set forth in claim 8 wherein:

said strip of ferromagnetic material is ferrite, and said means producing magnetic flux in said strip includes at least one permanent magnet.

10. An oscillator as set forth in claim 8 wherein said means producing magnetic flux in said strip of ferromagnetic material is comprised of a permanent magnet adhered to said conductive surface.

11. An oscillator as set forth in claim 8 wherein: said means producing magnetic flux in said strip of ferromagnetic material is comprised of:

dielectric support members adhered to the surface of said substrate on opposite sides of said top conductor, and a permanent magnet mounted on said support members so as to be spaced from said top conductor.

12. An oscillator as set forth in claim 8 wherein said means producing magnetic flux in said strip of ferromagnetic material is comprised of:

a layer of dielectric material adhered to said strip of ferromagnetic material, and a permanent magnet is adhered to said layer of dielectric material.

13. An oscillator as set forth in claim 8 wherein:

said means for producing magnetic flux in said ferromagnetic material is comprised of a conductor wrapped around said strip of ferromagnetic material and said substrate.

14. An oscillator as set forth in claim 8 wherein:

said strip of ferromagnetic material is hexagonal ferrite, and said means producing magnetic flux in said strip is the orientation of particles within said strip of hexagonal ferrite brought about by previously subjecting it to a magnetic field.

* * * * *